US011378500B2

(12) United States Patent
Hu

(10) Patent No.: US 11,378,500 B2
(45) Date of Patent: Jul. 5, 2022

(54) FIXING JIG

(71) Applicant: Wuhan China Star Optoelectronics Technology Co., Ltd., Wuhan (CN)

(72) Inventor: Guan Hu, Wuhan (CN)

(73) Assignee: Wuhan China Star Optoelectronics Technology Co., Ltd., Wuhan (CN)

(*) Notice: Subject to any disclaimer, the term of this patent is extended or adjusted under 35 U.S.C. 154(b) by 346 days.

(21) Appl. No.: 16/753,811

(22) PCT Filed: Nov. 8, 2019

(86) PCT No.: PCT/CN2019/116692
§ 371 (c)(1),
(2) Date: Apr. 6, 2020

(87) PCT Pub. No.: WO2021/017267
PCT Pub. Date: Feb. 4, 2021

(65) Prior Publication Data
US 2021/0404923 A1    Dec. 30, 2021

(30) Foreign Application Priority Data

Jul. 29, 2019  (CN) .......................... 201910690744.3

(51) Int. Cl.
*G01N 3/08*    (2006.01)
*H05K 1/03*    (2006.01)
*G01N 3/04*    (2006.01)
*G01N 19/04*    (2006.01)

(52) U.S. Cl.
CPC ................ *G01N 3/08* (2013.01); *G01N 3/04* (2013.01); *G01N 19/04* (2013.01); *H05K 1/0393* (2013.01); *G01N 2203/0017* (2013.01); *G01N 2203/0019* (2013.01); *G01N 2203/0206* (2013.01); *G01N 2203/04* (2013.01); *G01N 2203/0405* (2013.01); *G01N 2203/0447* (2013.01); *G01N 2203/0458* (2013.01); *H05K 2201/05* (2013.01)

(58) Field of Classification Search
CPC ............ G01N 3/08; G01N 3/04; G01N 19/04; G01N 2203/0017; G01N 2203/0019; G01N 2203/0206; G01N 2203/04; G01N 2203/0405; G01N 2203/0447; G01N 2203/0458; H05K 1/0393; H05K 2201/05
See application file for complete search history.

(56) References Cited

FOREIGN PATENT DOCUMENTS

| CN | 101854010 | 10/2010 |
|----|-----------|---------|
| CN | 101965125 | 2/2011  |
| CN | 201965082 | 9/2011  |
| CN | 203606236 | 5/2014  |
| CN | 204287008 | 4/2015  |

(Continued)

*Primary Examiner* — Benjamin R Schmitt

(57) ABSTRACT

A fixing jig is provided, including a supporting base, a fixing plate, and a fixing component. The supporting base includes a first upper surface. The fixing plate is disposed on the supporting base. A side of the fixing plate is pivotally connected to the supporting base and includes a second upper surface, a bottom surface, and via a hole. The fixing component presses the fixing plate on the second upper surface. The fixing jig can fix an object pending testing and allows one flexible electric circuit board of the object pending testing to be exposed outside of the fixing jig, so that when performing a pull force test, this can allow an angle between two flexible electric circuit boards to be 90 degrees, thereby improving accuracy of an experimental result.

20 Claims, 4 Drawing Sheets

(56) References Cited

FOREIGN PATENT DOCUMENTS

| | | |
|---|---|---|
| CN | 204514702 | 7/2015 |
| CN | 205141349 | 4/2016 |
| CN | 105911727 | 8/2016 |
| CN | 206348259 | 7/2017 |
| CN | 206410991 | 8/2017 |
| CN | 209264535 | 8/2019 |
| CN | 110346286 | 10/2019 |
| JP | H07318479 | 12/1995 |
| KR | 2010-0092775 | 8/2010 |
| KR | 2015-0069913 | 6/2015 |

FIXING JIG

RELATED APPLICATIONS

This application is a National Phase of PCT Patent Application No. PCT/CN2019/116692 having International filing date of Nov. 8, 2019, which claims the benefit of priority of Chinese Patent Application No. 201910690744.3 filed on Jul. 29, 2019. The contents of the above applications are all incorporated by reference as if fully set forth herein in their entirety.

FIELD AND BACKGROUND OF THE INVENTION

The present disclosure relates to the field of display technology, and particularly relates to a fixing jig.

Generally, during production processes or stages of verifying new products of thin film transistor liquid crystal display (TFT-LCD) products using chip on film (COF) technology, adhesive force (flexible printed circuit pulling force, FPC pulling force) between a flexible electric circuit board (flexible printed circuit, FPC) and glass will be tested to prevent defective products due to an unqualified FPC pulling force. This test needs the FPC and the glass to always be kept at a 90 degrees angle state in a vertical stretch during the pulling process, and a value of separating force between the FPC and the glass is recorded.

However, because COF products have two connected FPCs, besides testing a standard pulling force between one of the FPCs and the glass, an adhesive force between the two FPCs also needs to be tested. If using jigs in the prior arts to perform a stretching test, an angle between two FPCs will range from 90 degrees to 180 degrees, and the vertical stretch cannot be realized completely, so this makes test data inadequate and experimental results inaccurate.

Therefore, a fixing jig is necessary to solve the technical problem existing in the prior art.

SUMMARY OF THE INVENTION

The purpose of the present disclosure is to solve the technical problem that uses jigs in the prior arts to perform a stretching test, an angle between two FPCs will range from 90 degrees to 180 degrees, and the vertical stretch cannot be realized completely, so this makes references of tested data are inadequate and experimental results inaccurate.

In order to solve the technical problem mentioned above, one purpose of the present disclosure is to provide a fixing jig. The fixing jig can fix an object pending testing and allows one flexible electric circuit board of the object pending testing to be exposed outside the fixing jig, so that when performing a pull force test, this can allow an angle between two flexible electric circuit boards to be 90 degrees, thereby improving accuracy of an experimental result.

Based on the purpose mentioned above, the present disclosure provides a fixing jig, and after the fixing jig fixes the object pending testing, the object pending testing is pulled by a pull force testing equipment. The object pending testing includes a first flexible circuit board and a second flexible circuit board, and the second flexible circuit board is bonded on the first flexible circuit board. The fixing jig includes a supporting base, a fixing plate, and a fixing component. The supporting base includes a first upper surface. The fixing plate is disposed on the supporting base. A side of the fixing plate is pivotally connected to the supporting base and includes a second upper surface, a bottom surface, and a via hole. A fixing component presses the fixing plate on the second upper surface. Furthermore, the object pending testing is clamped between the first upper surface and the bottom surface, and the pull force testing equipment pulls the second flexible circuit board of the object pending testing through the via hole.

Preferably, the fixing jig of the present disclosure further includes a plurality of positioning components, and the plurality of positioning components are disposed on the first upper surface to block the object pending testing from moving in a horizontal direction.

Preferably, the plurality of positioning components include pin nails.

Preferably, the fixing jig of the present disclosure further includes an anti-slip component disposed on the bottom surface and in contact with the object pending testing when the object pending testing is clamped between the first upper surface and the bottom surface.

Preferably, the anti-slip component includes an anti-static rubber layer.

Preferably, the fixing component includes a pressing part and a control lever, and the pressing part is connected to the control lever.

Preferably, the control lever controls the pressing part to press on the second upper surface or to be away from the second upper surface.

Preferably, the pressing part includes rubber.

Preferably, the supporting base, the fixing plate, and the fixing component include aluminum alloy.

Preferably, the fixing jig includes stainless steel.

Based on the purpose mentioned above, the present disclosure further provides a fixing jig, and after the fixing jig fixes the object pending testing, the object pending testing is pulled by a pull force testing equipment. The object pending testing includes a first flexible circuit board and a second flexible circuit board, and the second flexible circuit board is bonded on the first flexible circuit board. The fixing jig includes a supporting base, a fixing plate, a fixing component, and a plurality of positioning components. The supporting base includes a first upper surface. The fixing plate is disposed on the supporting base. A side of the fixing plate is pivotally connected to the supporting base and includes a second upper surface, a bottom surface, and a via hole. A fixing component presses the fixing plate on the second upper surface. The plurality of positioning components disposed on the first upper surface. Furthermore, the object pending testing is clamped between the first upper surface and the bottom surface, the pull force testing equipment pulls the second flexible circuit board of the object pending testing through the via hole, and the plurality of positioning components block the object pending testing from moving in a horizontal direction.

Preferably, the plurality of positioning components include pin nails.

Preferably, the fixing jig of the present disclosure further includes an anti-slip component disposed on the bottom surface and in contact with the object pending testing when the object pending testing is clamped between the first upper surface and the bottom surface.

Preferably, the anti-slip component includes an anti-static rubber layer.

Preferably, the fixing component includes a pressing part and a control lever, the pressing part is connected to the control lever, and the control lever controls the pressing part to press on the second upper surface or to be away from the second upper surface.

Based on the purpose mentioned above, the present disclosure further provides a fixing jig, and after the fixing jig fixes the object pending testing, the object pending testing is pulled by a pull force testing equipment. The object pending testing includes a first flexible circuit board and a second flexible circuit board, and the second flexible circuit board is bonded on the first flexible circuit board. The fixing jig includes a supporting base, a fixing plate, a fixing component, and an anti-slip component. The supporting base includes a first upper surface. The fixing plate is disposed on the supporting base. A side of the fixing plate is pivotally connected to the supporting base and includes a second upper surface, a bottom surface, and a via hole. The fixing component presses the fixing plate on the second upper surface. The anti-slip component is disposed on the bottom surface. Furthermore, the object pending testing is clamped between the first upper surface and the bottom surface, the anti-slip component contacts with the object pending testing, and the pull force testing equipment pulls the second flexible circuit board of the object pending testing through the via hole.

Preferably, the anti-slip component includes an anti-static rubber layer.

Preferably, the fixing jig of the present disclosure further includes a plurality of positioning components, and the plurality of positioning components are disposed on the first upper surface to block the object pending testing from moving in a horizontal direction.

Preferably, the fixing component includes a pressing part and a control lever, and the pressing part is connected to the control lever.

Preferably, the control lever controls the pressing part to press on the second upper surface or to be away from the second upper surface.

In order to allow the above contents of the present disclosure to be more obvious and easier to be understood, preferred embodiments of the present disclosure will be described in detail with reference to the accompanying drawings hereinafter.

The beneficial effects of the present disclosure is that the fixing jig can fix the object pending testing and allows one flexible electric circuit board of the object pending testing be exposed outside of the fixing jig, so that when performing a pull force test, this can allow an angle between two flexible electric circuit boards to be 90 degrees, thereby improving accuracy of an experimental result.

DESCRIPTION OF SPECIFIC EMBODIMENTS OF THE INVENTION

Figure 1:
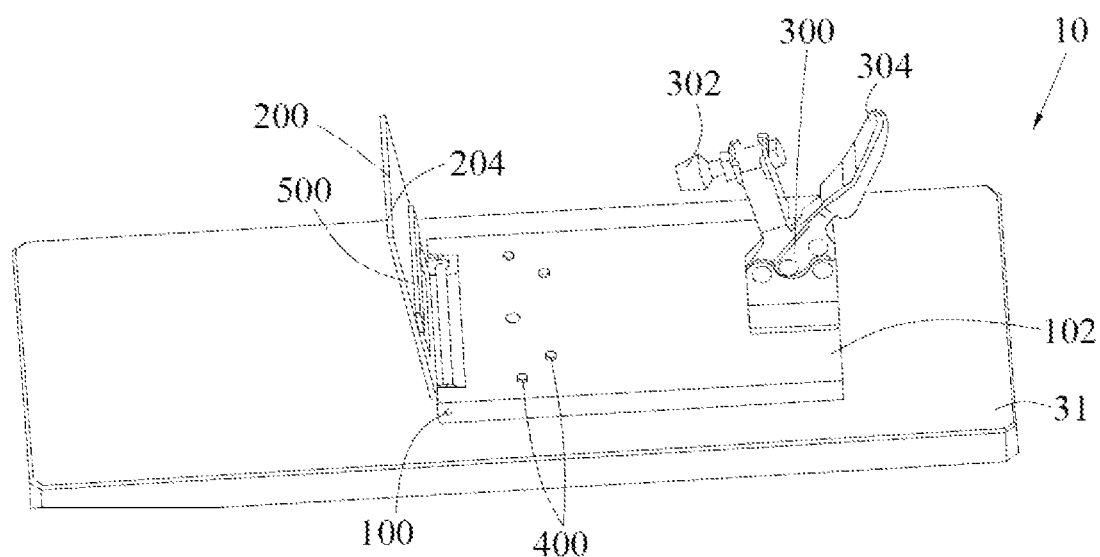
FIG. 1 is a first schematic diagram of a fixing jig of the present disclosure.

In order to allow the above and other purposes, features, and advantages of the present disclosure to be more obvious and easier to understand, preferred embodiments of the present disclosure will be particularly described hereinafter, and with reference to the accompanying drawings, a detailed description will be given below. Moreover, the directional terms of which the present disclosure mentions, for example, "upper", "lower", "top", "bottom", "front", "rear", "left", "right", "inside", "outside", "side", "circumference", "center", "horizontal", "vertical", "axial", "radial", "top layer", "bottom layer", etc., only refer to directions of the accompanying figures. Therefore, the adopted directional terms are used to describe and understand the present disclosure, but the present disclosure is not limited thereto.

In the figures, units with similar structures are indicated by the same reference numerals.

Figure 2:
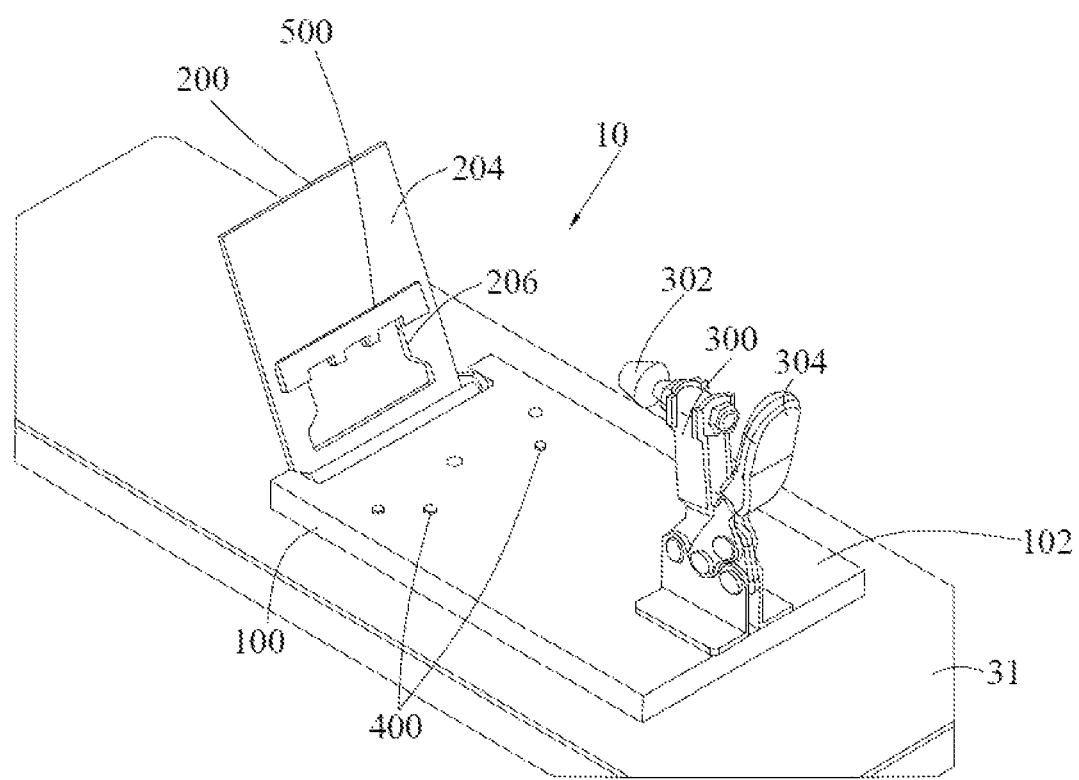
FIG. 2 is a second schematic diagram of the fixing jig of the present disclosure.
Figure 3:
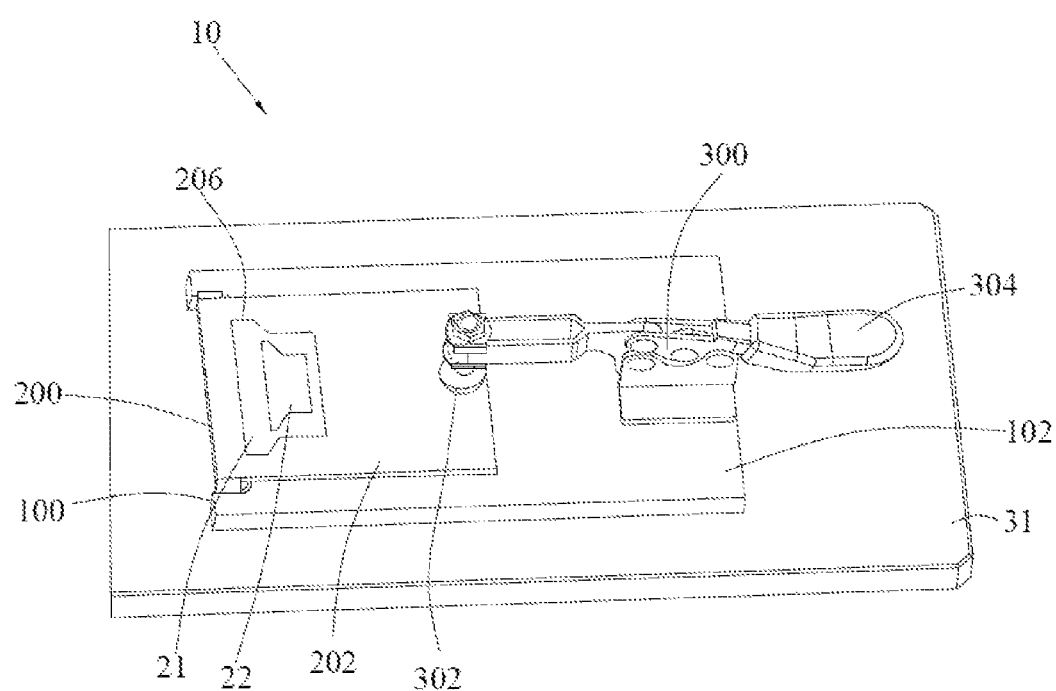
FIG. 3 is a third schematic diagram of the fixing jig of the present disclosure.
Figure 4:
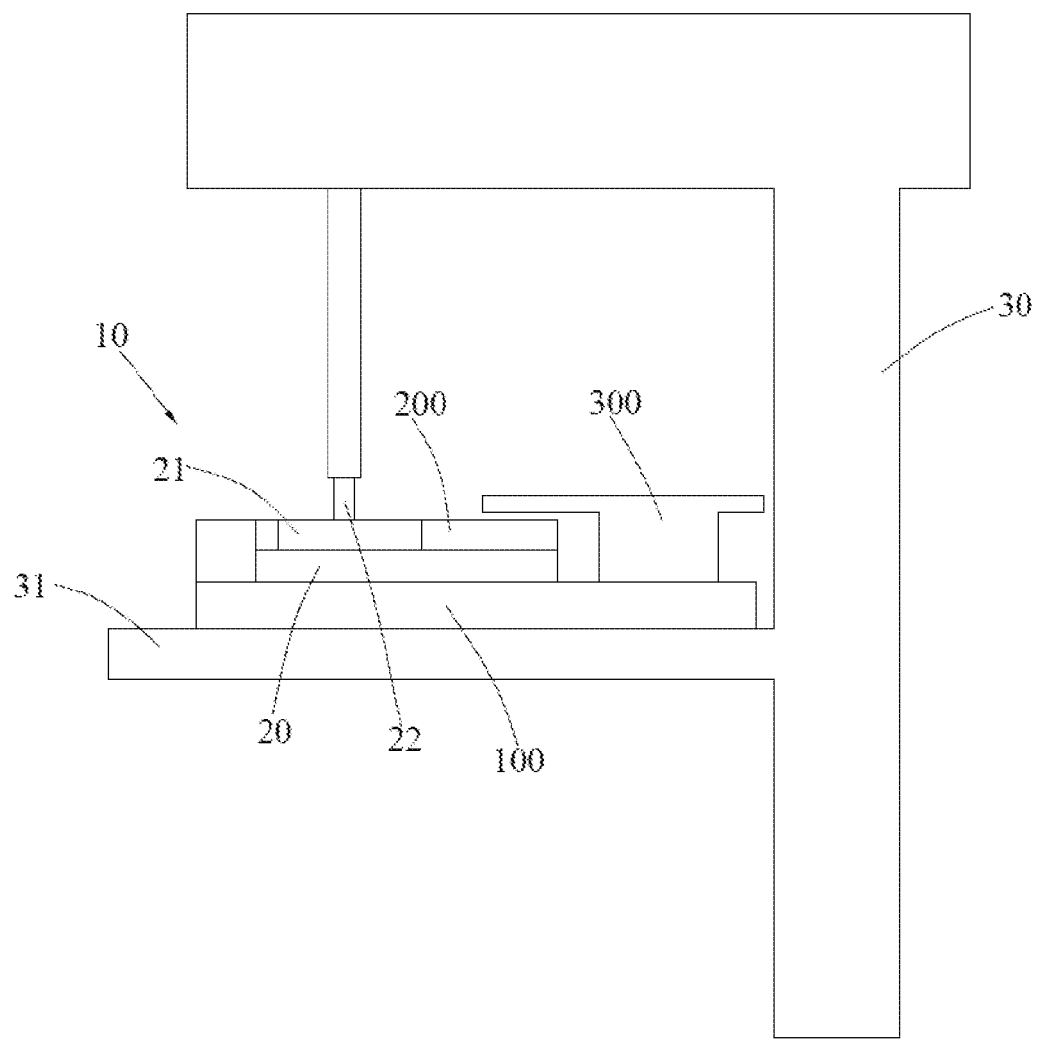
FIG. 4 is a fourth schematic diagram of the fixing jig of the present disclosure.

Please refer to FIG. 1 to FIG. 4, FIG. 1 to FIG. 4 are first to fourth schematic diagrams of a fixing jig 10 of the present disclosure. The fixing jig 10 of the present disclosure, wherein after an object pending testing 20 is fixed, the object pending testing 20 is pulled by a pull force testing equipment 30. The object pending testing 20 includes a first flexible circuit board 21 and a second flexible circuit board 22, and the second flexible circuit board 22 is bonded on the first flexible circuit board 21. Furthermore, in an embodiment, the object pending testing 20 is a thin film transistor liquid crystal display (TFT-LCD) product with a small size or a medium size using chip on film (COF) technology. The fixing jig 10 of the present disclosure is to fix the object pending testing 20 to test an adhesive force between two first flexible circuit boards (flexible printed circuits, FPCs). The fixing jig 10 of the present disclosure includes a supporting base 100, a fixing plate 200, and a fixing component 300.

The supporting base 100 includes a first upper surface 102 and is disposed on a test base 31 of the pull force testing equipment 30. The fixing plate 200 is disposed on the supporting base 100. A side of the fixing plate 200 is pivotally connected to the supporting base 100 and includes a second upper surface 202, a bottom surface 204, and a via hole 206.

In an embodiment, the supporting base 100, the fixing plate 200, and the fixing component 300 include aluminum alloy. Therefore, the fixing plate 200 not only has sufficient rigidity but also has light weight. In another embodiment, the fixing plate 200 includes stainless steel, which can prevent the object pending testing 20 from being polluted due to oxidative corrosion on the fixing plate 200. In addition, the fixing plate 200 can also provide sufficient rigidity to resist a stress occurring when the pull force testing equipment 30 pulls the object pending testing 20.

The fixing component 300 is pressed on the second upper surface 202 of the fixing plate 200, and the object pending testing 20 is clamped between the first upper surface 102 and the bottom surface 204. The pull force testing equipment 30 pulls the second flexible circuit board 22 of the object pending testing 20 through the via hole 206. When the pull force testing equipment 30 pulls the second flexible circuit board 22 of the object pending testing 20 through the via hole 206, an included angle between the first flexible circuit board 21 and the second flexible circuit board 22 is 90 degrees.

Furthermore, in an embodiment, the object pending testing 20 can be cropped alone and can be put into the fixing jig 10 of the present disclosure. Afterwards, the second flexible circuit board 22 to be tested is exposed through the via hole 206, and the first flexible circuit board 21 and other components are fixed in the fixing jig 10 of the present disclosure. Next, the fixing plate 200 covers the object pending testing 20, and the fixing component 300 is used to press the fixing plate 200. At this time, the second flexible circuit board 22 exposed outside the fixing jig 10 is connected to the pull force testing equipment 30, and after a stretch speed of the pull force testing equipment 30 is set, the object pending testing 20 can be tested. Therefore, this can realize vertical stretch with an angle at 90 degrees between the first flexible circuit board 21 and the second flexible circuit board 22, thereby improving accuracy of an experimental result.

In an embodiment, the fixing jig 10 of the present disclosure further includes a plurality of positioning components 400. The plurality of positioning components 400 are disposed on the first upper surface 102 to block the object pending testing 20 from moving in a horizontal direction. Therefore, this can ensure that the object pending testing 20 will not slip on the first upper surface 102, thereby improving accuracy of the experimental result. Each of the positioning components 400 can be arranged on the first upper surface 102 according to a shape of the object pending testing 20 to surely block the object pending testing 20 from moving in the horizontal direction. In another embodiment, the plurality of positioning components 400 include pin nails and may also include aluminum alloy or other soft material. For example, the soft material can be an anti-static rubber to prevent the object pending testing 20 from damage due to collision or other problems, and can prevent static electricity from occurring.

In an embodiment, the fixing jig 10 of the present disclosure further includes an anti-slip component 500. The anti-slip component 500 is disposed on the bottom surface 204 and is in contact with the object pending testing 20 to prevent the object pending testing 20 from slipping when the object pending testing 20 is clamped between the first upper surface 102 and the bottom surface 204.

In another embodiment, the anti-slip component 500 includes an anti-static rubber layer. Therefore, when the object pending testing 20 is clamped between the first upper surface 102 and the bottom surface 204, this can not only prevent the object pending testing 20 from slipping and prevent static electricity from occurring, but can also reduce a probability of damage caused to the object pending testing 20 when the fixing plate 200 covers the object pending testing 20.

In an embodiment, the fixing component 300 includes a pressing part 302 and a control lever 304. The pressing part 302 is connected to the control lever 304, and the control lever 304 can control the pressing part 302 to press on the second upper surface 202 or to be away from the second upper surface 202. In an embodiment, the pressing part 302 includes rubber. Therefore, this can make the pressing part 302 press on the second upper surface 202 tightly.

Furthermore, when pulling up the control lever 304, the pressing part 302 can be controlled to be away from the second upper surface 202. When pressing the control lever 304, the pressing part 302 can be controlled to be pressed on the second upper surface 202. In another embodiment, when pressing the control lever 304, the pressing part 302 can be controlled to be away from the second upper surface 202. When pulling up the control lever 304, the pressing part 302 can be controlled to be pressed on the second upper surface 202. Therefore, the fixing component 300 may have different appearances to achieve an effect of controlling the pressing part 302 to press on the second upper surface 202 or to be away from the second upper surface 202.

In summary, the fixing jig 10 of the present disclosure can fix the object pending testing 20 and allows one flexible electric circuit board of the object pending testing 20 to be exposed outside of the fixing jig 10, so that when performing a pull force test, this can allow an angle between two flexible electric circuit boards to be 90 degrees, thereby improving accuracy of an experimental result.

Although the disclosure has been shown and described with respect to one or more implementations, equivalent alterations and modifications will occur to others skilled in the art based upon a reading and understanding of this specification and the annexed drawings. The disclosure includes all such modifications and alterations, and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such features may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

The above are preferred embodiments of the present disclosure. It should be noted that those skilled in the art can further make many changes and modifications without departing from the technical theory of the present disclosure, and the changes and the modifications should be considered as the scope of protection of the present disclosure.

What is claimed is:

1. A fixing jig, wherein after fixing an object pending testing, a pull force testing equipment pulls the object pending testing, and wherein the object pending testing comprises a first flexible circuit board and a second flexible circuit board, and the second flexible circuit board is bonded on the first flexible circuit board, wherein the fixing jig comprises:
   a supporting base comprising a first upper surface;
   a fixing plate disposed on the supporting base, wherein a side of the fixing plate is pivotally connected to the supporting base and comprises a second upper surface, a bottom surface, and a via hole; and
   a fixing component pressing the fixing plate on the second upper surface;
   wherein the object pending testing is clamped between the first upper surface and the bottom surface, and the pull force testing equipment pulls the second flexible circuit board of the object pending testing through the via hole.

2. The fixing jig as claimed in claim 1, wherein the fixing jig comprises a plurality of positioning components, and the plurality of positioning components are disposed on the first upper surface to block the object pending testing from moving in a horizontal direction.

3. The fixing jig as claimed in claim 2, wherein the plurality of positioning components comprise pin nails.

4. The fixing jig as claimed in claim 1, wherein the fixing jig comprises an anti-slip component disposed on the bottom surface and in contact with the object pending testing when the object pending testing is clamped between the first upper surface and the bottom surface.

5. The fixing jig as claimed in claim 4, wherein the anti-slip component comprises an anti-static rubber layer.

6. The fixing jig as claimed in claim 1, wherein the fixing component comprises a pressing part and a control lever, and the pressing part is connected to the control lever.

7. The fixing jig as claimed in claim 6, wherein the control lever controls the pressing part to press on the second upper surface or to be away from the second upper surface.

8. The fixing jig as claimed in claim 6, wherein the pressing part comprises rubber.

9. The fixing jig as claimed in claim 1, wherein the supporting base, the fixing plate, and the fixing component comprise aluminum alloy.

10. The fixing jig as claimed in claim 1, wherein the fixing plate comprises stainless steel.

11. A fixing jig, wherein after fixing an object pending testing, a pull force testing equipment pulls the object pending testing, and wherein the object pending testing comprises a first flexible circuit board and a second flexible circuit board, and the second flexible circuit board is bonded on the first flexible circuit board, wherein the fixing jig comprises:
- a supporting base comprising a first upper surface;
- a fixing plate disposed on the supporting base, wherein a side of the fixing plate is pivotally connected to the supporting base and comprises a second upper surface, a bottom surface, and a via hole;
- a fixing component pressing the fixing plate on the second upper surface; and
- a plurality of positioning components disposed on the first upper surface;
- wherein the object pending testing is clamped between the first upper surface and the bottom surface, the pull force testing equipment pulls the second flexible circuit board of the object pending testing through the via hole, and the plurality of positioning components block the object pending testing from moving in a horizontal direction.

12. The fixing jig as claimed in claim 11, wherein the plurality of positioning components comprise pin nails.

13. The fixing jig as claimed in claim 11, wherein the fixing jig comprises an anti-slip component disposed on the bottom surface and in contact with the object pending testing when the object pending testing is clamped between the first upper surface and the bottom surface.

14. The fixing jig as claimed in claim 13, wherein the anti-slip component comprises an anti-static rubber layer.

15. The fixing jig as claimed in claim 11, wherein the fixing component comprises a pressing part and a control lever, the pressing part is connected to the control lever, and the control lever controls the pressing part to press on the second upper surface or to be away from the second upper surface.

16. A fixing jig, wherein after fixing an object pending testing, a pull force testing equipment pulls the object pending testing, and wherein the object pending testing comprises a first flexible circuit board and a second flexible circuit board, and the second flexible circuit board is bonded on the first flexible circuit board, wherein the fixing jig comprises:
- a supporting base comprising a first upper surface;
- a fixing plate disposed on the supporting base, wherein a side of the fixing plate is pivotally connected to the supporting base and comprises a second upper surface, a bottom surface, and a via hole;
- a fixing component pressing the fixing plate on the second upper surface; and
- an anti-slip component disposed on the bottom surface;
- wherein the object pending testing is clamped between the first upper surface and the bottom surface, the anti-slip component is in contact with the object pending testing, and the pull force testing equipment pulls the second flexible circuit board of the object pending testing through the via hole.

17. The fixing jig as claimed in claim 16, wherein the anti-slip component comprises an anti-static rubber layer.

18. The fixing jig as claimed in claim 16, wherein the fixing jig comprises a plurality of positioning components, and the plurality of positioning components are disposed on the first upper surface to block the object pending testing from moving in a horizontal direction.

19. The fixing jig as claimed in claim 16, wherein the fixing component comprises a pressing part and a control lever, and the pressing part is connected to the control lever.

20. The fixing jig as claimed in claim 19, wherein the control lever controls the pressing part to press on the second upper surface or to be away from the second upper surface.

* * * * *